United States Patent
Mitsumori et al.

(10) Patent No.: US 6,644,327 B1
(45) Date of Patent: Nov. 11, 2003

(54) ULTRASONIC CLEANER AND WET TREATMENT NOZZLE COMPRISING THE SAME

(75) Inventors: Kenichi Mitsumori, Miyagi-ken (JP); Yasuhiko Kasama, Miyagi-ken (JP); Nobuaki Haga, Miyagi-ken (JP); Shoichi Ono, Miyagi-ken (JP); Junichiro Soejima, Tokyo (JP); Norihisa Takahashi, Tokyo (JP); Akio Fujie, Tokyo (JP); Mineo Iwasaki, Kanagawa-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/521,906

(22) Filed: Mar. 9, 2000

(30) Foreign Application Priority Data

Mar. 10, 1999 (JP) .......................... 11-063102

(51) Int. Cl.[7] ................................ B08B 3/00
(52) U.S. Cl. ......................... 134/184; 134/1; 134/1.3; 134/122 R; 134/147; 134/186; 310/326; 68/355; 366/114; 366/115; 366/127
(58) Field of Search .................... 134/1, 1.3, 122 R, 134/147, 184, 186; 310/326; 68/355; 366/114, 115, 127

(56) References Cited

U.S. PATENT DOCUMENTS 5,783,790 A 7/1998 Mitsumori et al.

FOREIGN PATENT DOCUMENTS

| DE | 39 33 519 A | 4/1991 |
|---|---|---|
| DE | 41 15 096 A | 11/1992 |
| EP | 0 603 008 A | 6/1994 |
| FR | 2 549 745 A | 2/1985 |
| GB | 1 455 124 A | 11/1976 |

*Primary Examiner*—Randy Gulakowski
(74) *Attorney, Agent, or Firm*—Brinks Hofer Gilson & Lione

(57) ABSTRACT

A second housing whose center portion is depressed and whose end portion around the center portion is formed like a visor is arranged around a first housing whose center portion is depressed and whose end portion around the center portion is formed like a visor, and a hollow portion is formed between the first housing and the second housing by sandwiching a packing between the end portions of the housings. Further, degassed water for preventing empty heating is filled in the hollow portion, and an ultrasonic transducer is placed on the surface of the center portion of the first housing. A weight for preventing the vibration of the wall is provided on the wall surface of the second housing. Since the vibration of the wall of the housing is suppressed by the weight, vibration energy returns toward the bottom surface of the center of the housing through water and is radiated from the bottom surface efficiently as ultrasonic waves.

26 Claims, 15 Drawing Sheets

ULTRASONIC CLEANER AND WET TREATMENT NOZZLE COMPRISING THE SAME

BACKGROUND OF THE INVENTION

1. Field of the Invention

The present invention relates to an ultrasonic cleaner for irradiating an object to be cleaned in a cleaning liquid with ultrasonic waves generated from an ultrasonic transducer and to a wet treatment nozzle comprising the same.

2. Related Art

Heretofore, an ultrasonic shower cleaner 450 as shown in FIG. 21 has been used to clean liquid crystal panels and semiconductor wafers. In this ultrasonic shower cleaner 450, a hollow portion 452 for storing a cleaning liquid S is formed in the inside of a housing 451 and a liquid feed port 453 for supplying the cleaning liquid S into the hollow portion 452 is formed in an upper portion of a side wall of the housing 451 as shown in the figure. A nozzle 454 for discharging the cleaning liquid S is formed in the lower portion of the housing 451 and an ultrasonic transducer 455 is installed on the top surface of the housing 451. To clean an object P to be cleaned, this object P is caused to pass under the ultrasonic shower cleaner 450 and the cleaning liquid S is poured upon the surface of the object P by driving the ultrasonic transducer 455 by means of an unshown ultrasonic wave generator.

However, as the amount of the cleaning liquid is large in this cleaning method, a water-saving ultrasonic cleaner 460 shown in FIG. 22 is conceivable. This ultrasonic cleaner 460 has a housing 461 whose center portion 461a is depressed and whose end portion 461b is formed like a visor, an ultrasonic transducer 462 is placed on the surface of the center portion of the housing 461, and the object P passing through the cleaning liquid S under the housing 461 is irradiated with ultrasonic waves to be cleaned by vibrating the ultrasonic transducer 462.

An ultrasonic cleaner 470 shown in FIG. 23 is also conceivable though its cleaning method is similar to the above cleaning method. This ultrasonic cleaner 470 has a first housing 471 whose center portion 471a is depressed and whose end portion 471b around the center portion 471a is formed like a visor and a second housing 472 surrounding this first housing 471, whose center portion 472a is depressed and whose end portion 472b around the center portion 472a is formed like a visor. A packing 473 is sandwiched between the end portions 471b and 472b of these housings 471 and 472, and a hollow portion 474 is formed between the first housing 471 and the second housing 472. Further, a liquid for preventing empty heating, such as water 475, is filled in this hollow portion 474 and an ultrasonic transducer 476 is installed on the surface of the center portion of the first housing 471 so that the object P passing through the cleaning liquid S under the second housing 472 is irradiated with ultrasonic waves through water 475 in the hollow portion 474 to be cleaned by vibrating the ultrasonic transducer 476.

In the case of the ultrasonic cleaner 460 shown in FIG. 22 which is of a water-saving type, the vibration energy of the ultrasonic transducer 462 vibrates the bottom surface of the housing 461 and is radiated onto the object P through the cleaning liquid S. However, it also vibrates the wall surface of the housing 461, resulting in the waste of energy.

In the case of the ultrasonic cleaner 470 shown in FIG. 23, the thickness of the packing slightly differs according to clamping force, whereby the thickness of the hollow portion 474, that is, the depth of water filled in the hollow portion 474 differs. In this system that the object is irradiated with ultrasonic waves through water, sound pressure radiated from the sound wave radiation surface which is the bottom surface of the center portion of the second housing greatly changes according to variations in the depth of water from the relationship between the wavelength of an ultrasonic wave and the depth of water. In other words, the radiation sound pressure is greatly affected by the clamping force of the packing and lacks stability. When the depth of water is not appropriate and radiation sound pressure from the ultrasonic wave radiation surface is small, part of energy radiated from the ultrasonic transducer which is not used effectively may be used and wasted as energy for vibrating the wall surface of the second housing and may affect other devices by the vibration of the housing.

SUMMARY OF THE INVENTION

It is an object of the present invention to provide an ultrasonic cleaner which facilitates the control of ultrasonic wave radiation efficiency and a wet treatment nozzle comprising the same.

According to a first aspect of the present invention, there is provided an ultrasonic cleaner which comprises a housing having an U-shaped cross section, an ultrasonic transducer placed on the inner surface of the U-shaped portion of the housing and a weight provided on the housing to prevent the vibration of the wall of the housing.

According to this constitution, ultrasonic energy is radiated efficiency from the bottom as ultrasonic waves without leaking to the wall.

The above weight may be placed on the inner wall surface or outer wall surface if it improves the rigidity of the housing. It may be placed on at least one of the outer wall surface and inner wall surface of the housing.

The above weight prevents energy from the ultrasonic transducer from escaping to the housing. If it is placed on the inner bottom surface where the ultrasonic transducer is installed, ultrasonic energy does not leak to the outside from the weight installation portion. Therefore, it may be placed on the inner bottom surface of the housing in an area where vibration caused by the ultrasonic transducer is not prevented.

The above weight may be formed by changing the thickness of the housing itself as means of improving the rigidity of the housing because the same function can be achieved by making the thickness of a predetermined portion larger than other portions.

Preferably, the above weight is provided on the entire surface of the wall of the housing to improve the rigidity of the housing and prevent energy from the ultrasonic transducer from propagating to the wall by shifting the characteristic frequency of the wall from the frequency of vibration input to prevent the resonance of the wall.

According to a second aspect of the present invention, there is provided a wet treatment nozzle which comprises an introduction passage for introducing a treatment liquid on one side, an exhaust passage for exhausting the treatment liquid after a wet treatment on the other side, and a vibration guide member for guiding the treatment liquid introduced from the introduction passage to an object to be treated and wet treating the object while vibrating it, wherein the vibration guide member is the above-mentioned ultrasonic cleaner.

With this nozzle, the treatment liquid can be supplied onto the surface to be treated and the used treatment liquid can be suitably exhausted through the exhaust passage, thereby making it possible to always treat the surface with a fresh treatment liquid and prevent the surface from being contaminated by the used treatment liquid again.

Since the treatment liquid is held in a space between the surface to be treated and the vibration guide member with pressure balance such as interfacial tension, the surface can be wet treated with the required minimum of the treatment liquid and ultrasonic vibration can be provided to the surface to be treated without fail.

Since the ultrasonic cleaner having the weight is used as the vibration guide member, ultrasonic energy required for a wet treatment is obtained and an extremely good treatment can be made with the required minimum of the treatment liquid.

This wet treatment nozzle is provided with pressure control means of controlling a difference between the pressure of the treatment liquid in contact with the object to be treated and atmospheric pressure to prevent the treatment liquid in contact with the object to be treated from flowing into a passage other than the exhaust passage after a wet treatment. This pressure control means comprises a suction pump provided on a downstream side of the exhaust passage, a liquid feed pump provided on an upstream side of the introduction passage, a pressure sensor for detecting the pressure of the treatment liquid in contact with the object to be treated and a controller for controlling the driving of the suction pump and the liquid feed pump according to a signal from the pressure sensor.

According to a third aspect of the present invention, there is provided an ultrasonic cleaner which comprises a housing having an U-shaped cross section and a hollow portion therein, an ultrasonic transducer placed on the inner bottom surface of the inner U-shaped portion of the housing, a liquid for preventing empty heating charged into the hollow portion to transmit vibration from the ultrasonic transducer to the outer bottom surface of the outer U-shaped portion of the housing, and a weight provided on the housing to prevent the vibration of the wall of the housing.

According to this constitution, vibration is prevented by the weight when the thickness of the hollow portion, that is, the depth of the liquid for preventing empty heating, for example, water does not match the wavelength of an ultrasonic wave according to the fastening degree of a packing and when energy generated by the ultrasonic transducer tries to vibrate the bottom surface of the outer U-shaped portion of the housing through the liquid for preventing empty heating. Therefore, vibration energy returns toward the bottom of the center portion of the housing through the liquid for preventing empty heating and is radiated from the bottom efficiently as ultrasonic waves.

The liquid for preventing empty heating is preferably a degassed liquid. By degassing, the flow rate of the liquid for preventing empty heating (circulation for cooling) can be greatly reduced. If the liquid for preventing empty heating contains many bubbles, the same phenomenon as empty heating may occur.

Since the weight is means of improving the rigidity of the housing itself, it may be placed on the outer wall surface or the inner wall surface. It is desirably placed on at least one of the outer wall surface and the inner wall surface forming the above outer U-shaped portion of the housing.

In this case, the weight may be placed on at least one of the outer wall surface and the inner wall surface forming the inner U-shaped portion of the housing to prevent ultrasonic vibration energy from the ultrasonic transducer installed on the inner U-shaped portion from escaping to the wall by increasing the rigidity of the wall of the inner U-shaped portion.

The weight is placed outside an area corresponding to the ultrasonic transducer installed on the inner U-shaped portion on the inner bottom surface of the outer U-shaped portion to prevent ultrasonic energy from leaking to the wall from a portion around the inner bottom surface of the outer U-shaped portion. The weight is placed outside the ultrasonic transducer installed on the inner U-shaped portion to prevent ultrasonic energy from leaking to the wall from the inner bottom surface of the inner U-shaped portion. Therefore, the weight may be placed on at least one of the inner bottom surface of the outer U-shaped portion and the bottom surface of the inner U-shaped portion of the housing in an area where vibration caused by the ultrasonic transducer is not prevented.

The weight changes the rigidity of the housing itself. As mean of attaining this, a new weight may be added or the thickness of a required portion is made appropriate. Therefore, the means may be formed by changing the thickness of the outer U-shaped portion or the inner U-shaped portion of the housing.

Preferably, the weight is provided on the entire surface of the wall of the housing to improve the rigidity of the housing and prevent energy from the ultrasonic transducer from propagating to the wall by shifting the characteristic frequency of the wall from the frequency of vibration input to prevent the resonance of the wall.

Preferably, the housing is constructed such that a second housing whose center portion is depressed and whose end portion around the center portion is formed like a visor is arranged around a first housing whose center portion is depressed and whose end portion around the center portion is formed like a visor, and a hollow portion is formed between the first housing and the second housing by sandwiching a packing between the end portions of the housings.

In the housing, an appropriate liquid is placed in this hollow portion, thereby making it possible to prevent the breakage of the ultrasonic transducer caused by heating without a wet treatment liquid under the housing. When the wet treatment liquid is located below the housing, sufficient ultrasonic energy can be propagated to the wet treatment liquid.

According to a fourth aspect of the present invention, there is provided an ultrasonic cleaner in which the packing is made of an elastic member having a through hole in the center, the first housing and the second housing are made of a plate member, the elastic member is sandwiched between the visor-like end portion of the first housing and the visor-like end portion of the second housing with a bolt penetrating the end portions, and the thickness of the packing can be changed by adjusting the fastening degree of the bolt.

According to this constitution, the thickness of the elastic member sandwiched between the visor-like end portion of the first housing and the visor-like end portion of the second housing can be adjusted by controlling the fastening degree of the bolt, thereby making it easy to adjust the radiation strength of ultrasonic waves.

According to a fifth aspect of the present invention, there is provided a wet treatment nozzle which comprises an introduction passage for introducing a treatment liquid on one side, an exhaust passage for exhausting the treatment liquid after a wet treatment on the other side and a vibration guide member, interposed between the introduction passage and the exhaust passage, for guiding the treatment liquid introduced from the introduction passage to an object to be treated and wet treating the object while vibrating it, wherein the above vibration guide member is the above-mentioned ultrasonic cleaner of the present invention.

With this nozzle, the treatment liquid can be supplied onto the surface to be treated and the used treatment liquid can be suitably exhausted through the exhaust passage, thereby making it possible to always treat the surface with a fresh treatment liquid and prevent the surface from being contaminated by the used treatment liquid again.

Since the treatment liquid is held in a space between the surface to be treated and the vibration guide member with pressure balance such as interfacial tension, the surface can be wet treated with the required minimum of the treatment liquid and ultrasonic vibration can be applied to the surface to be treated without fail.

In addition, even if the treatment liquid in the space between the ultrasonic vibration guide member and the treatment surface runs short, a liquid for preventing empty heating is existent in the space between the ultrasonic transducer and the ultrasonic vibration guide member, thereby making it possible to prevent the empty heating of the ultrasonic transducer without fail.

This wet treatment nozzle is also provided with pressure control means of controlling the difference between the pressure of the treatment liquid in contact with the object to be treated and atmospheric pressure to prevent the treatment liquid in contact with the object from flowing to the outside of the exhaust passage after the wet treatment.

BRIEF DESCRIPTION OF THE ACCOMPANYING DRAWINGS

DETAILED DESCRIPTION OF THE PREFERRED EMBODIMENTS

Preferred embodiments of an ultrasonic cleaner according to the present invention will be described hereinunder with reference to the accompanying drawings.

Figure 1A:
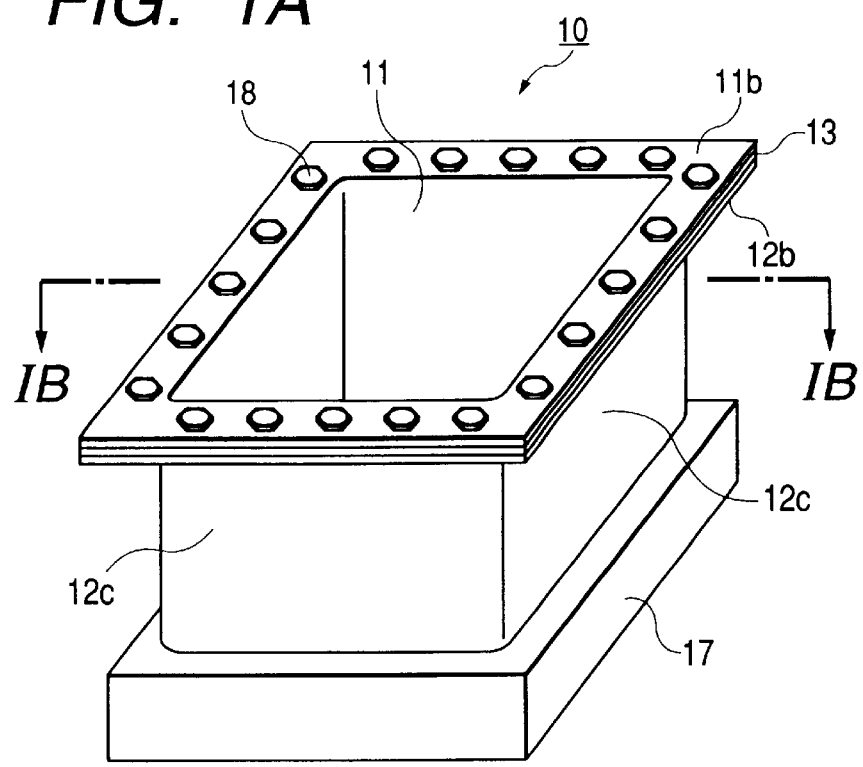
FIG. 1A is a perspective view of a first embodiment of an ultrasonic cleaner according to the present invention and FIG. 1B is an enlarged longitudinal sectional view cut on line Ib—Ib of FIG. 1A.
Figure 1B:
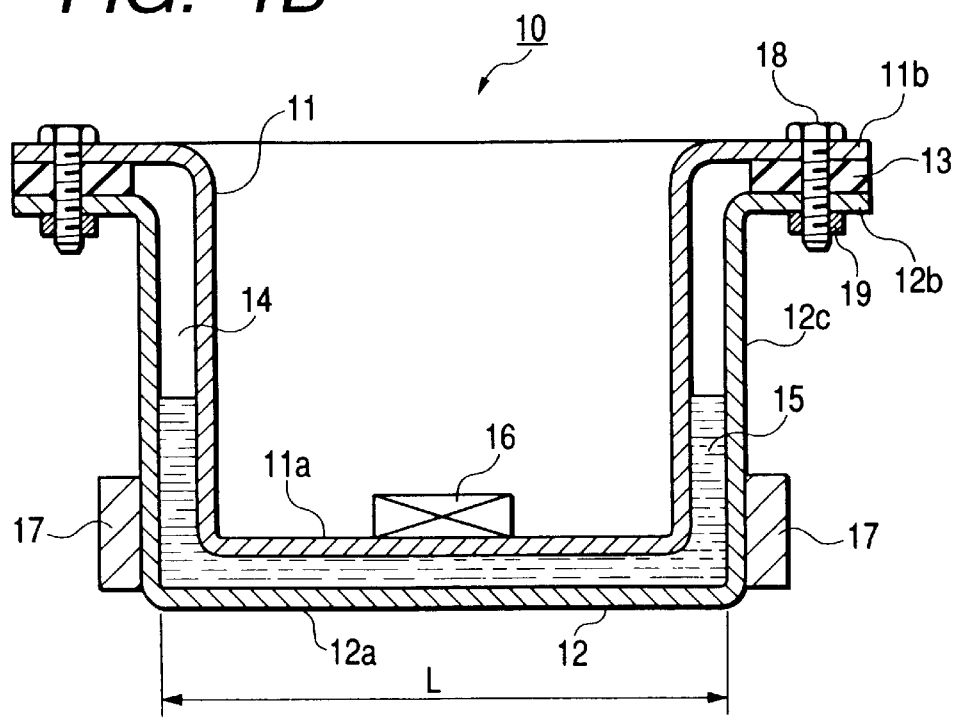

FIGS. 1A and 1B show the first embodiment of an ultrasonic cleaner according to the present invention.

This ultrasonic cleaner 10 has a tank-like first housing 11 whose center portion 11a is depressed and whose end portion 11b around the center portion 11a is formed like a visor and a tank-like second housing 12 surrounding this first housing 11, whose center portion 12a is depressed and whose end portion 12b around the center portion 12a is formed like a visor. A packing 13 is sandwiched between the end portions 11b and 12b of the housings 11 and 12 and a hollow portion 14 is formed between the first housing 11 and the second housing 12. The packing 13 is provided at the entire periphery between the end portions 11b and 12b of the first and second housings 11 and 12 and fastened by a plurality of bolts 18 and a plurality of nuts 19.

Water 15 which has been degassed as a liquid for preventing empty heating is charged into the hollow portion 14 formed between the first housing 11 and the second housing by sandwiching the packing 13 therebetween. Water 15 is filled in at least the space between the center portion 11a (bottom surface) of the first housing 11 and the center portion 12a (bottom surface) of the second housing 12. Further, an ultrasonic transducer 16 is installed on the surface of the center portion 11a of the first housing 11 and an object to be cleaned (not shown) passing through a cleaning liquid (not shown) under a radiation surface having the width L of the second housing 12 is irradiated with ultrasonic waves through water 15 in the hollow portion 14 by vibrating the ultrasonic transducer 16 to be cleaned.

A ring-shaped weight 17 is provided on the entire surface of the outer lower portion of the wall 12c of the second housing 12.

Figure 2:
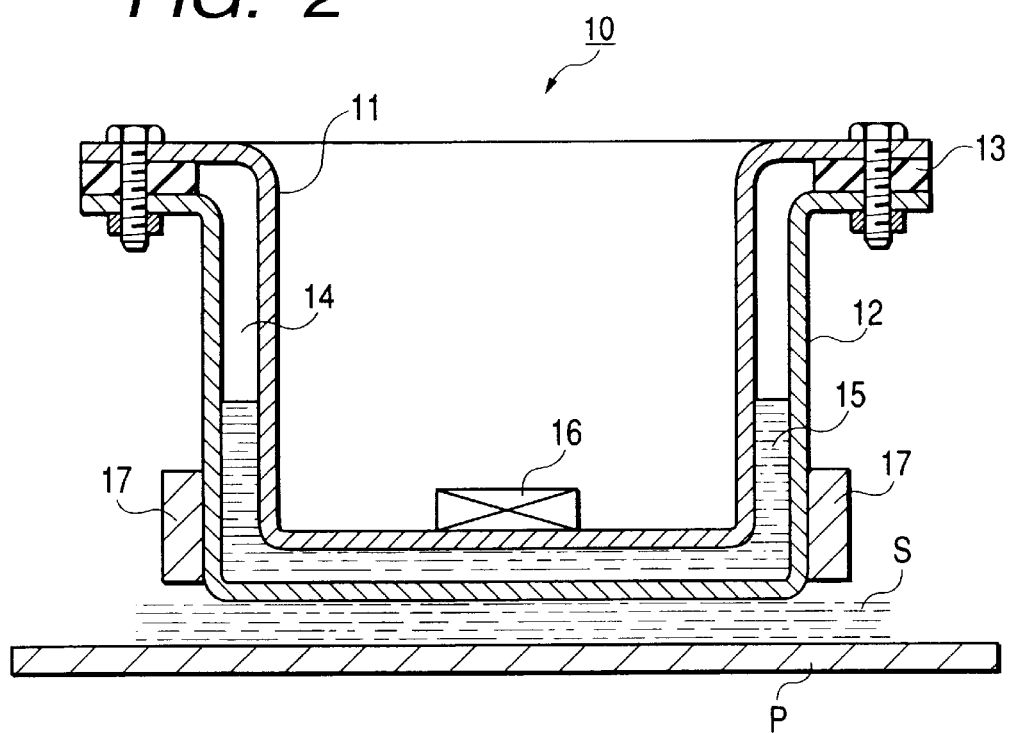
FIG. 2 is a longitudinal sectional view showing that an object to be cleaned is cleaned by the ultrasonic cleaner shown in FIGS. 1A and 1B.

A function and effect obtained by providing this weight 17 will be described hereinunder. As shown in FIG. 2, the center portion 12a of the second housing 12 of the ultrasonic cleaner 10 is immersed in the cleaning liquid S so that the object P to be cleaned passes under the ultrasonic cleaner 10. The ultrasonic transducer 16 is vibrated by an unshown ultrasonic wave generator to irradiate the object P passing under the radiation surface having the width L of the second housing 12 with ultrasonic waves through water 15 in the hollow portion 14 to clean it.

The hollow portion 14 is formed by sandwiching the packing 13 between the end portions 11b and 12b of the first housing 11 and the second housing 12 and fixing it by fastening. When the thickness of the hollow portion 14, that is, the depth of water 15 does not agree with the wavelength of an ultrasonic wave according to the fastening degree of the packing 13, radiation sound pressure from the sound wave radiation surface which is the bottom surface of the center portion 12a of the second housing 12 decreases. Although a component equivalent to a reduction in vibration energy radiated from the ultrasonic transducer 16 is used to vibrate the wall surface 12c of the second housing 12, the vibration of the wall surface 12c is suppressed by the weight 17. Therefore, the vibration energy returns toward the bottom surface 12a of the second housing 12 through water 15 to be radiated from the bottom surface 12a as an ultrasonic wave. As a result, energy generated from the ultrasonic transducer 16 can be irradiated onto the object to be cleaned efficiently irrespective of the fastening degree of the packing 13.

Thus, the weight 17 is provided to control changes in radiation sound pressure generated by changes in the depth of water which is affected by the fastening amount of the packing 13 to an almost fixed value.

The second to eighth embodiments of the ultrasonic cleaner according to the present invention will be described hereinunder with reference to FIGS. 3 to 8. Another weight is added to the weight 17 of the first embodiment shown in FIGS. 1A and 1B in these embodiments. The same members as those in FIGS. 1A and 1B are given the same reference symbols and their descriptions are omitted.

Figure 3:
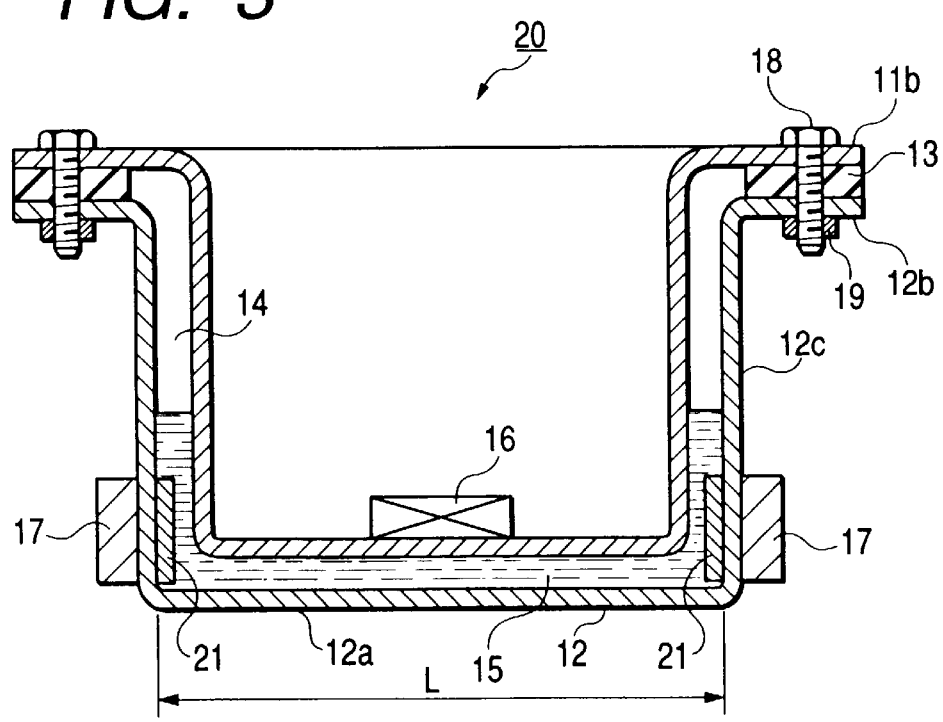
FIG. 3 is a longitudinal sectional view of a second embodiment of the ultrasonic cleaner according to the present invention.

The second embodiment shown in FIG. 3 is an ultrasonic cleaner 20 in which a second ring-shaped weight 21 is provided on the entire surface of the inner lower portion of the wall 12c of the housing 12. In the second embodiment, the weight 17 can be made smaller than that of the first embodiment by providing the second weight 21, whereby the width of the ultrasonic cleaner comprising the housing 12 and the weight 17 can be reduced. Also, the polishing of the under surface of the weight 17 can be carried out more easily.

Figure 4:
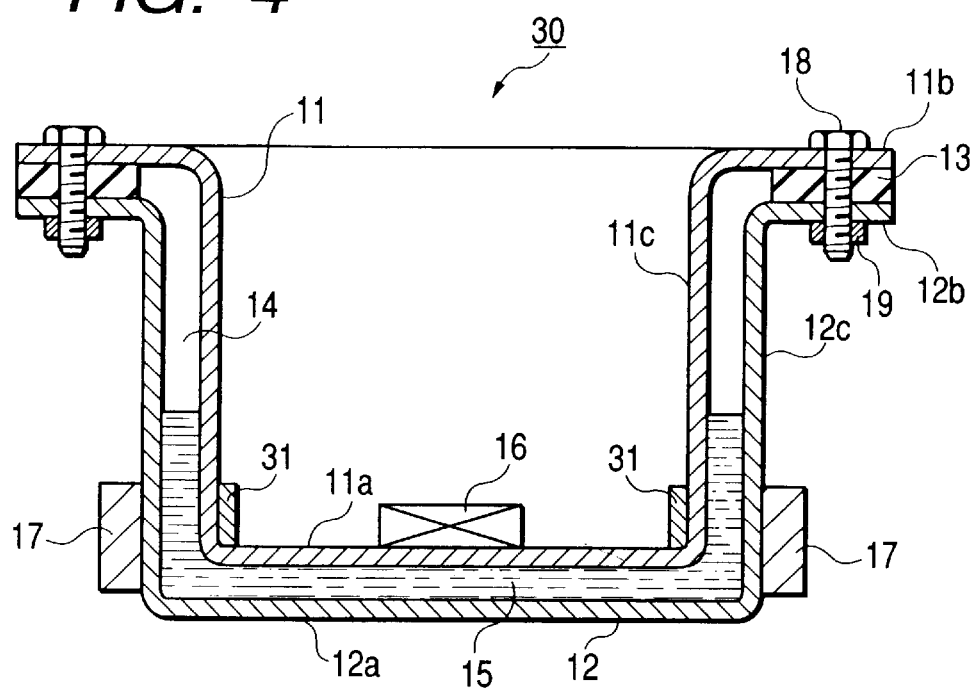
FIG. 4 is a longitudinal sectional view of a third embodiment of the ultrasonic cleaner according to the present invention.

The third embodiment shown in FIG. 4 is an ultrasonic cleaner 30 in which a third ring-shaped weight 31 is provided on the entire surface of the inner lower portion of the wall 11c of the first housing 11. The third embodiment can prevent ultrasonic energy radiated from the ultrasonic transducer 16 provided in the first housing 11 from propagating to the wall 11c more than the first embodiment by providing the third weight 31, whereby the proportion of ultrasonic energy propagating to the side of the liquid for preventing empty heating is greatly increased and the radiation of ultrasonic energy from the outer bottom surface 12a can be enhanced.

Figure 5:
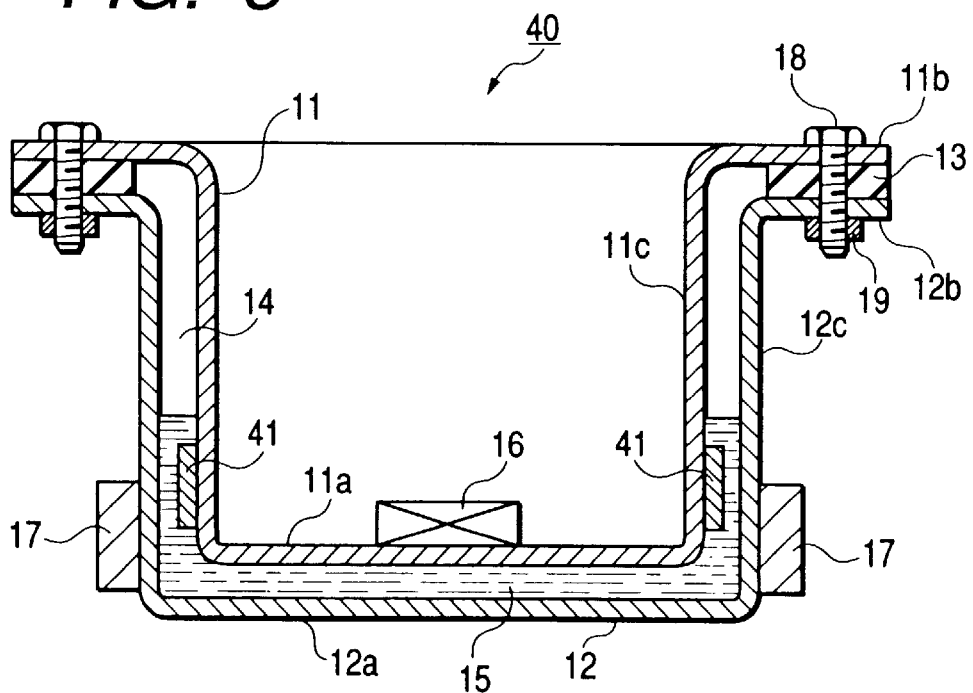
FIG. 5 is a longitudinal sectional view of a fourth embodiment of the ultrasonic cleaner according to the present invention.

The fourth embodiment shown in FIG. 5 is an ultrasonic cleaner 40 in which a fourth ring-shaped weight 41 is provided on the entire surface of the outer lower portion of the wall 11c of the first housing 11. The fourth embodiment obtains almost the same effect as that of the third embodiment by providing the fourth weight 41.

Figure 6:
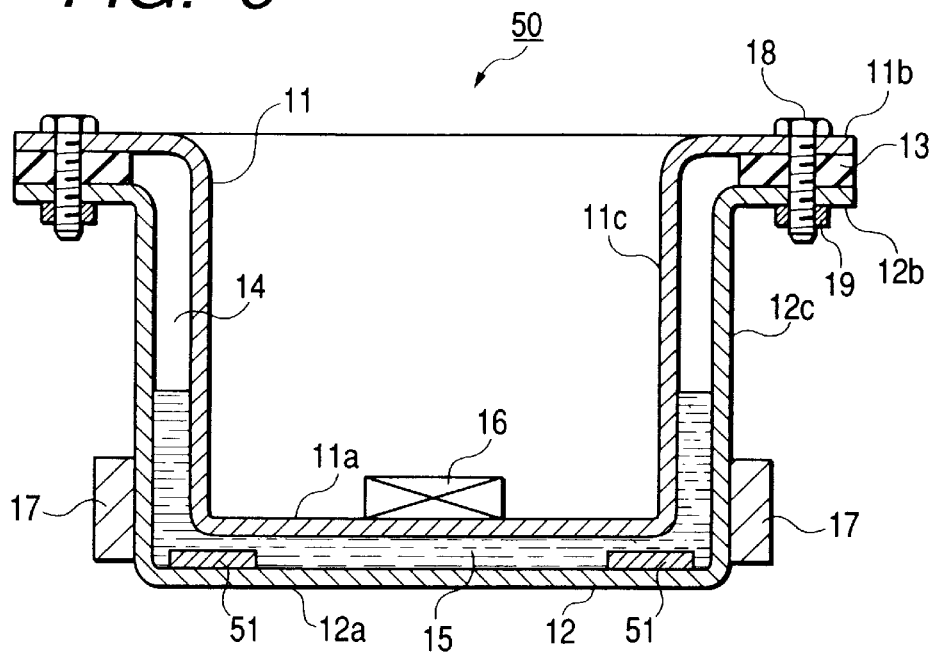
FIG. 6 is a longitudinal sectional view of a fifth embodiment of the ultrasonic cleaner according to the present invention.

The fifth embodiment shown in FIG. 6 is an ultrasonic cleaner 50 in which a fifth ring-shaped weight 51 is provided on the entire surface of the inner peripheral portion of the bottom 12a of the second housing 12. In the fifth embodiment, the weight 17 can be made smaller than that of the first embodiment, whereby the width of the ultrasonic cleaner comprising the housing 12 and the weight 17 can be reduced and the polishing of the under surface of the weight 17 can be carried out better, thereby making it possible to reduce production cost.

Figure 7:
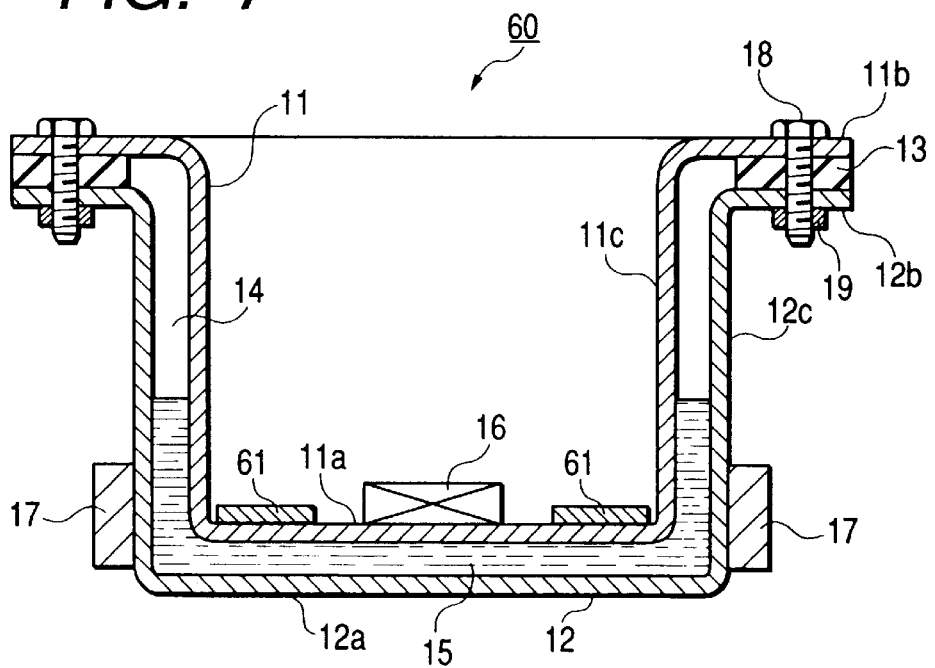
FIG. 7 is a longitudinal sectional view of a sixth embodiment of the ultrasonic cleaner according to the present invention.

The sixth embodiment shown in FIG. 7 is an ultrasonic cleaner 60 in which a sixth ring-shaped weight 61 is provided on the entire surface of the inner peripheral portion of the bottom 11a of the first housing 11. The sixth embodiment obtains almost the same effect as that of the third embodiment by providing the sixth weight 61.

Figure 8:
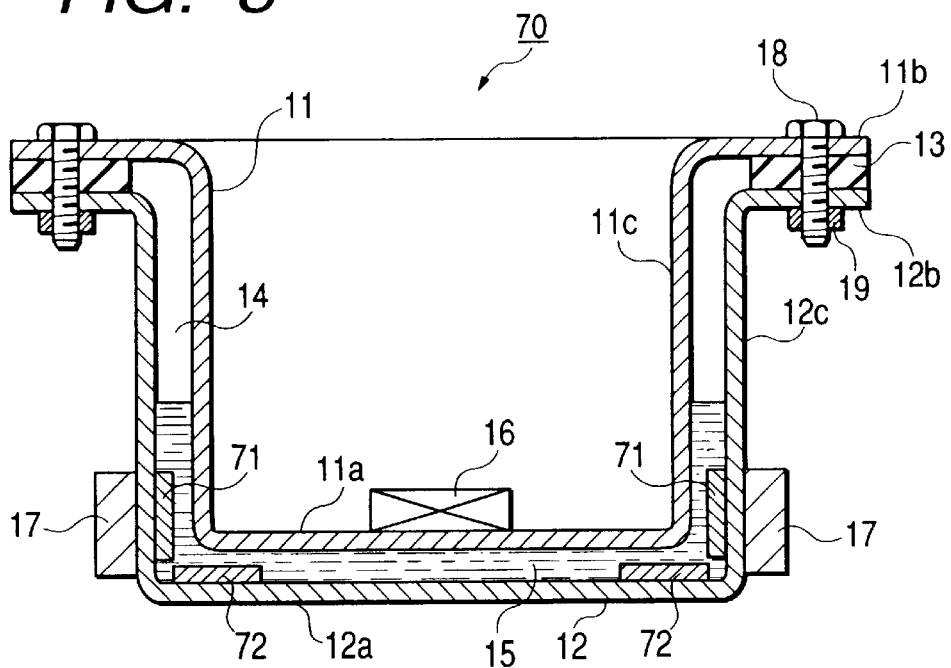
FIG. 8 is a longitudinal sectional view of a seventh embodiment of the ultrasonic cleaner according to the present invention.

The seventh embodiment shown in FIG. 8 is an ultrasonic cleaner 70 in which a seventh ring-shaped weight 71 is provided on the entire surface of the inner lower portion of the wall 12c of the second housing 12 and an eighth ring-shaped weight 72 is also provided on the entire surface of the inner peripheral portion of the bottom 12a of the second housing 12. In the seventh embodiment, the weight 17 can be made smaller than that of the fifth embodiment as compared with the first embodiment by providing the seventh weight 71 and the eighth weight 72, whereby the width of the total housing can be reduced, the weight 17 and a portion near the outer depressed portion 12 can be polished better than the fifth embodiment, and the stability of a wet treatment can be increased.

Figure 9:
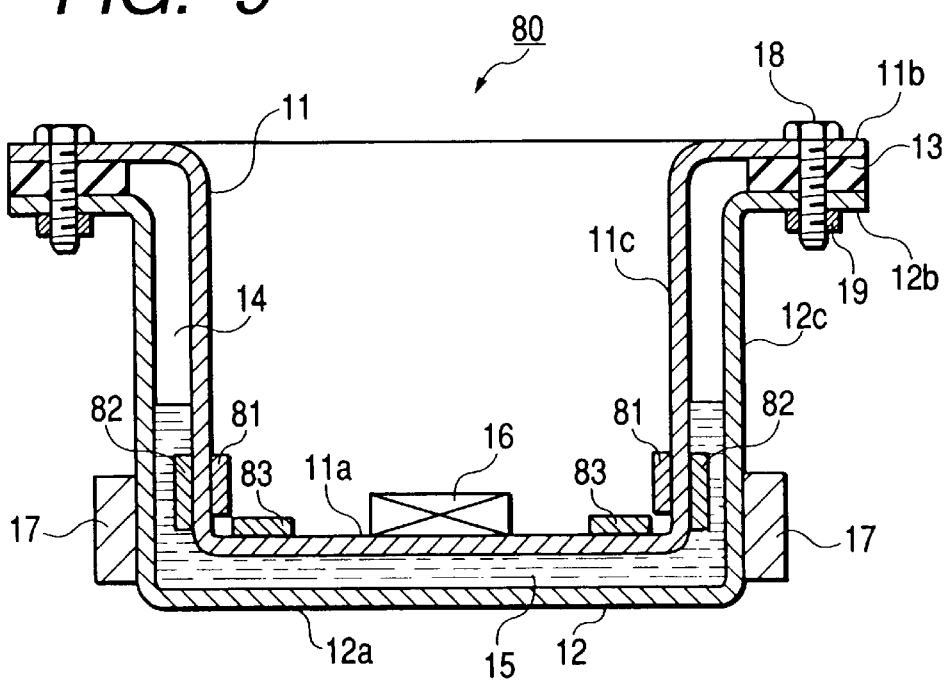
FIG. 9 is a longitudinal sectional view of an eighth embodiment of the ultrasonic cleaner according to the present invention.

The eighth embodiment shown in FIG. 9 is an ultrasonic cleaner 80 in which a ninth ring-shaped weight 81 is provided on the entire surface of the inner lower portion of the wall 11c of the first housing 11, a tenth ring-shaped weight 82 is provided on the entire surface of the outer lower portion of the wall 11c of the first housing 11 and an eleventh ring-shaped weight 83 is provided on the entire surface of the inner peripheral portion of the bottom 11a of the first housing 11. In the eighth embodiment, ultrasonic energy can be irradiated from the bottom 12a of the second housing 12 efficiently almost like the third embodiment by providing the ninth weight 81, the tenth weight 82 and the eleventh weight 83.

Further, the ninth and tenth embodiments of the ultrasonic cleaner according to the present invention will be described with reference to FIGS. 10 and 11, respectively. In these embodiments, the weight 17 of the first embodiment shown in FIGS. 1A and 1B is replaced by other weights which are placed in the first housing 11 or the second housing 12. The same members as those in FIGS. 1A and 1B are given the same reference symbols and their descriptions are omitted.

Figure 10A:
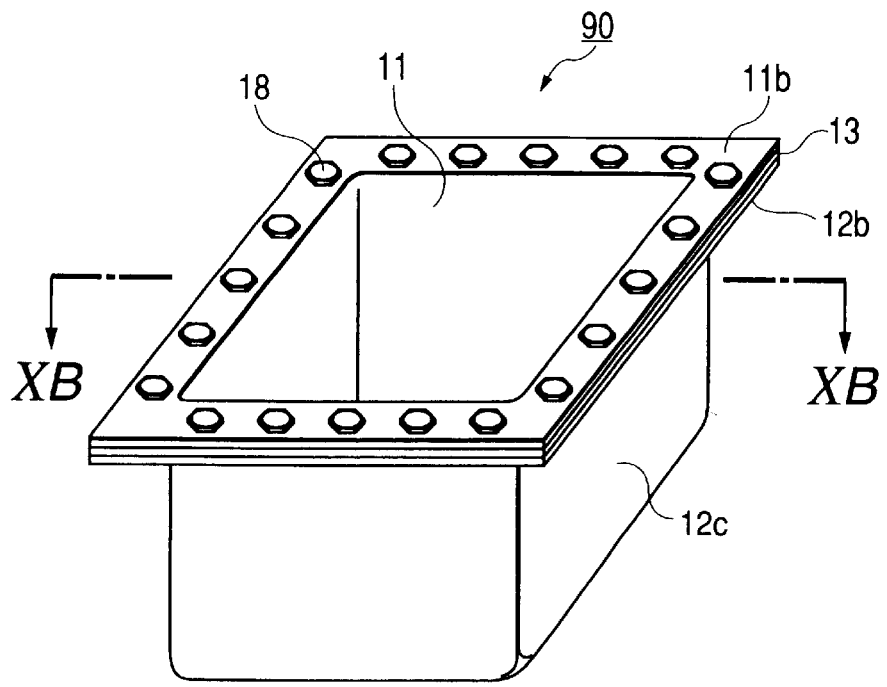
FIG. 10A is a perspective view of a tenth embodiment of the ultrasonic cleaner according to the present invention and FIG. 10B is an enlarged longitudinal sectional view cut on line Xb—Xb of FIG. 10A.
Figure 10B:
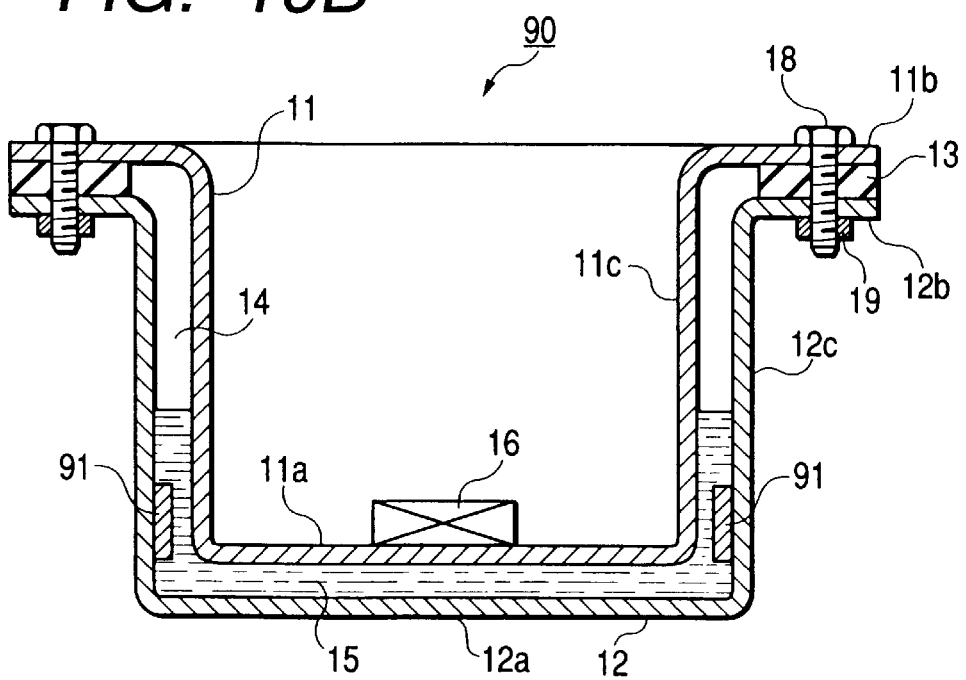

The ninth embodiment shown in FIGS. 10A and 10B is an ultrasonic cleaner 90 in which a twelfth ring-shaped weight 91 is provided on the entire surface of the inner lower portion of the wall 12c of the second housing 12. In the ninth embodiment, the width of a treatment nozzle is determined by the size of the second housing 12 unlike the first embodiment because the weight 17 is nonexistent and does not increase and the polishing of the outer wall surface and the outer bottom surface of the second housing 12 can be carried out extremely easily, thereby making it easy to manufacture a wet treatment nozzle.

Figure 11A:
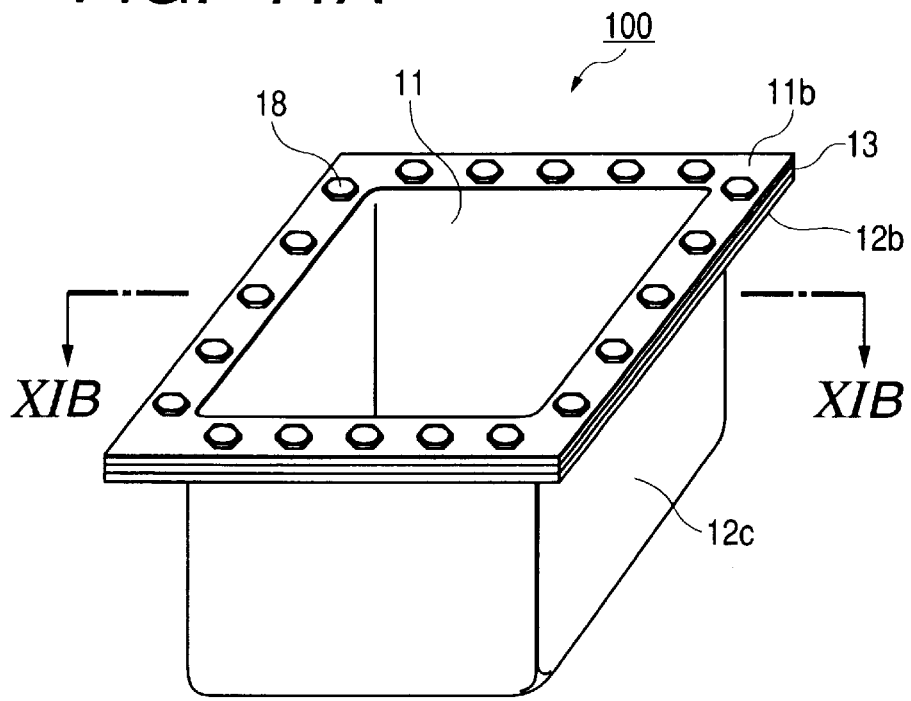
FIG. 11A is a perspective view of an eleventh embodiment of the ultrasonic cleaner according to the present invention and FIG. 11B is an enlarged longitudinal sectional view cut on line XIb—XIb of FIG. 11A.
Figure 11B:
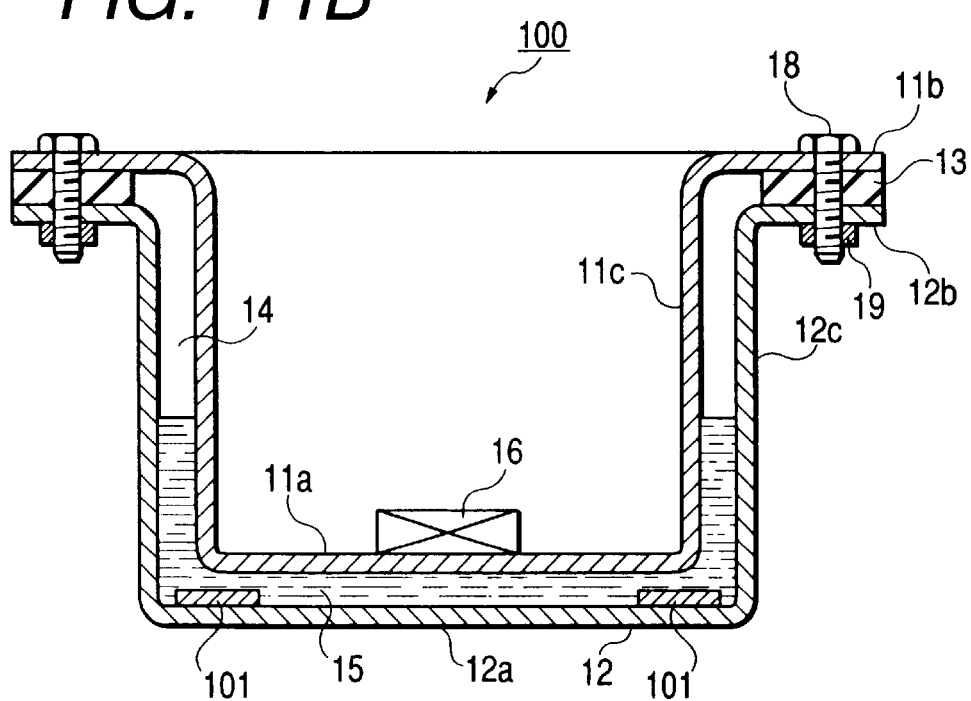

The tenth embodiment shown in FIGS. 11A and 11B is an ultrasonic cleaner 100 in which a thirteenth ring-shaped weight 101 is provided on the entire surface of the inner peripheral portion of the bottom 12a of the second housing 12. The tenth embodiment can obtain almost the same effect as that of the ninth embodiment by providing the thirteenth weight 101.

A preferred embodiment of a wet treatment nozzle according to the present invention which comprises the above ultrasonic cleaner will be described hereinunder with reference to FIGS. 12A and 12B.

This wet treatment nozzle 110 comprises an introduction passage 111 for introducing a treatment liquid (not shown) on one side, an exhaust passage 112 for exhausting the treatment liquid L after a wet treatment on the other side, and a vibration guide member 113, interposed between the introduction passage 111 and the exhaust passage 112, for guiding the treatment liquid introduced from the introduction passage 111 to an object to be treated (not shown) and wet treating the object while vibrating it. The ultrasonic cleaner 10 shown in FIGS. 1A and 1B is used as the vibration guide member 113. Therefore, the same members as those of FIGS. 1A and 1B are given the same reference symbols in FIGS. 12A and 12B and their descriptions are omitted.

Figure 12A:
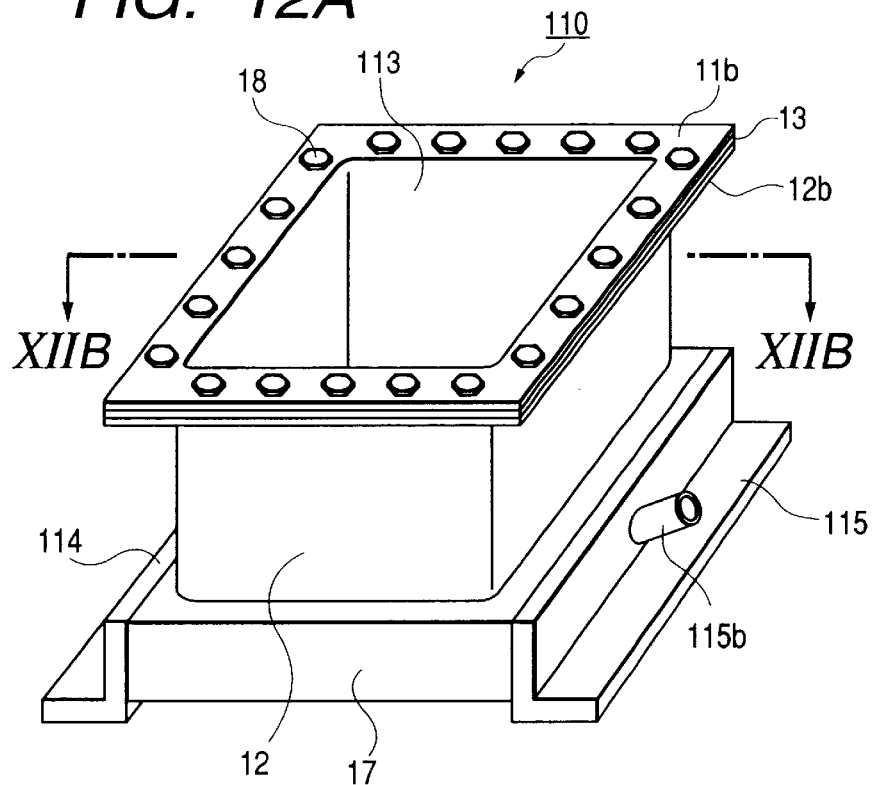
FIG. 12A is a perspective view of an embodiment of a wet treatment nozzle according to the present invention and FIG. 12B is an enlarged longitudinal sectional view cut on line XIIb—XIIb of FIG. 12A.
Figure 12B:
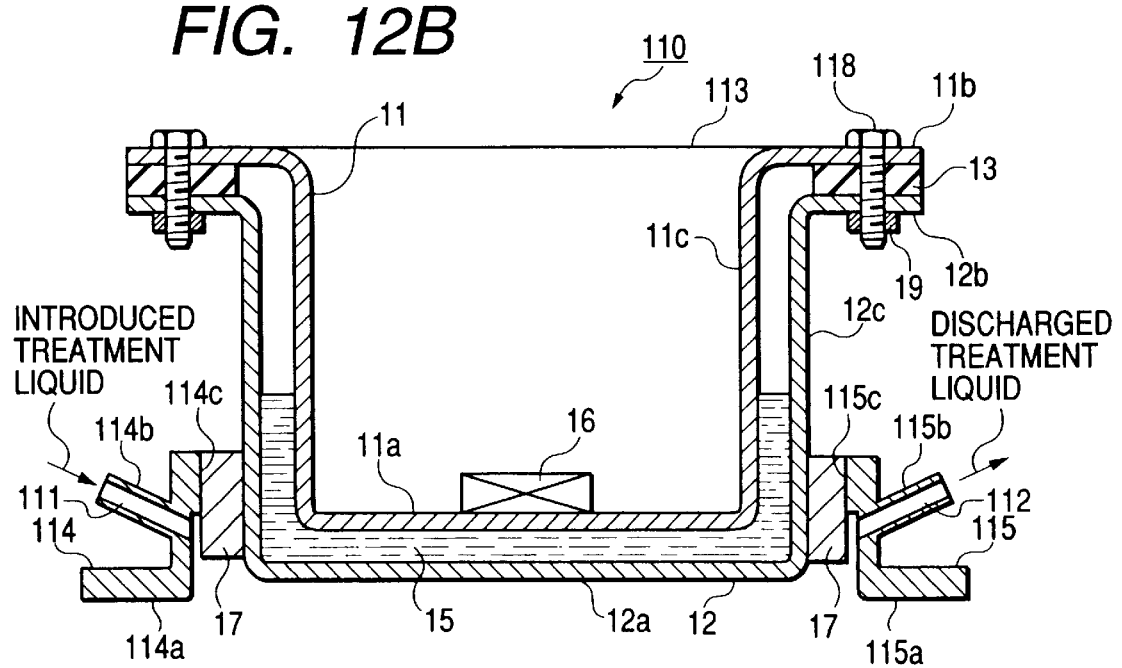

In FIGS. 12A and 12B, an introduction passage frame 114 having the introduction passage 111 formed therein is made of a stainless steel metal plate having an L-shaped cross section and its bottom 114a is made flush or almost flush with the bottom 12a of the vibration guide member. The introduction passage frame 114 has an introduction tube 114b extending obliquely upward in the center portion in a longitudinal direction and its wall 114c is connected to the weight 17 provided on the outer surface of the wall 12c of the vibration guide member by welding. This connection may be carried out with a bolt and a nut.

Similarly, the exhaust passage frame 115 having the exhaust passage 112 formed therein is made of a stainless steel metal plate having an L-shaped cross section and its bottom 115a is made flush or almost flush with the bottom 12a of the vibration guide member. The exhaust passage frame 115 has an exhaust tube 115b extending obliquely upward in the center portion in a longitudinal direction and its wall 115c is connected to the weight 17 provided on the outer surface of the wall 12c of the vibration guide member by welding. This connection may be carried out with a bolt and a nut.

This wet treatment nozzle 110 is provided with a pressure controller (not shown) for controlling the difference between the pressure of the treatment liquid in contact with the object to be treated and atmospheric pressure so that the treatment liquid in contact with the object does not flow to the outside of the exhaust passage after the wet treatment. This wet treatment nozzle 110 is also provided with a positioning unit (not shown) for maintaining a predetermined space between the vibration guide member 113 and the object and holding the treatment liquid in the space.

Figure 13:
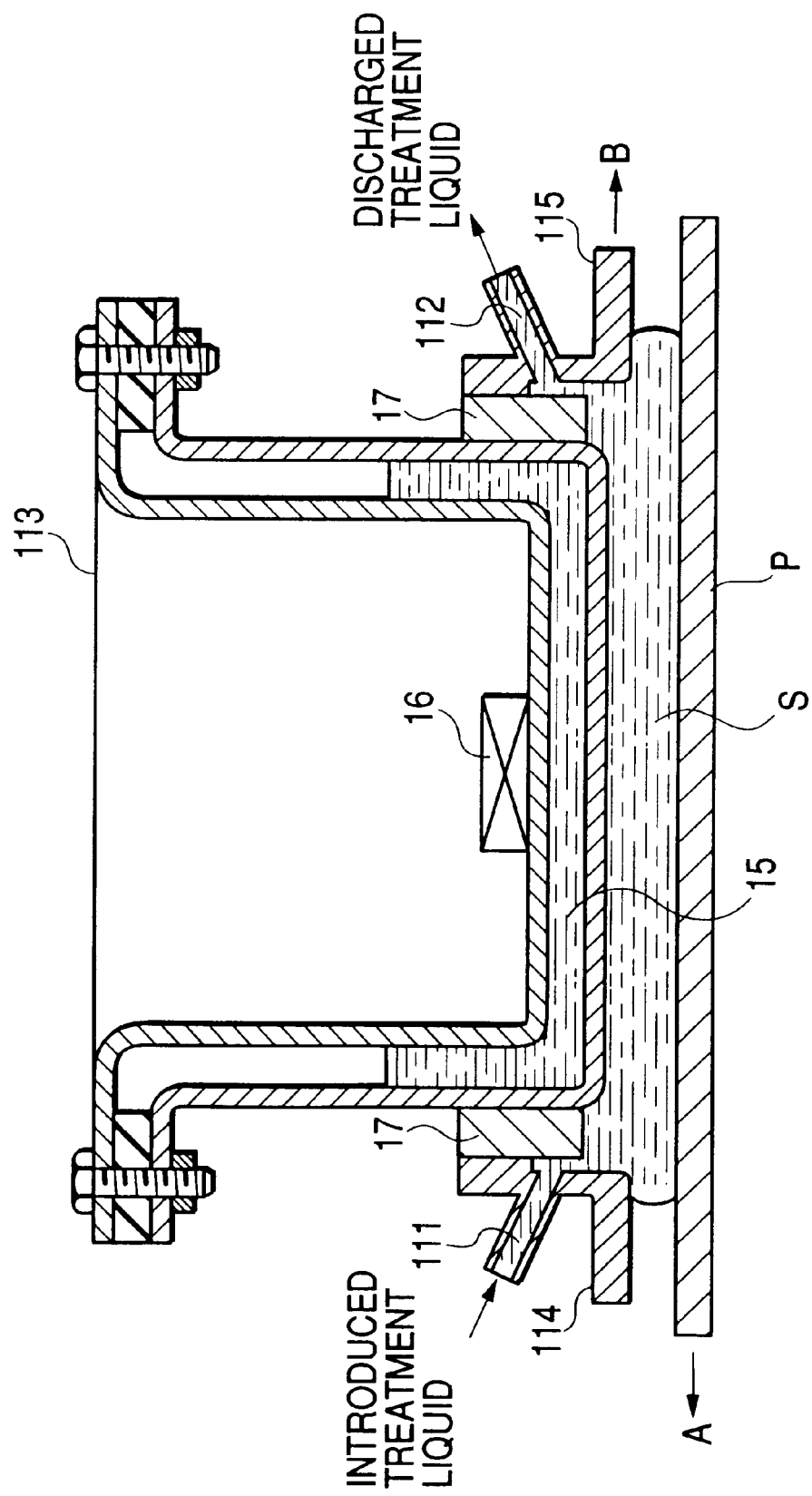
FIG. 13 is a longitudinal section view showing that an object to be cleaned is cleaned by the wet treatment nozzle shown in FIGS. 12A and 12B.

A wet treatment method using this wet treatment nozzle will be described with reference to FIG. 13.

The treatment liquid S, for example, ultra pure water, electrlyzed ion water, ozone water or hydrogen water is supplied to the object P to be treated through the introduction passage 111 while the object P to be treated and the wet treatment nozzle 110 are moved in directions A and B relative to each other, respectively, and the treatment liquid S is exhausted from above the object P without contacting a portion other than the portion to which the treatment liquid L is supplied by controlling the difference between the pressure of the treatment liquid S in contact with the object P and atmospheric pressure by means of the pressure controller (not shown).

The wet treatment nozzle shown in FIG. 12 comprises the ultrasonic cleaner shown in FIGS. 1A and 1B as the vibration guide member. The wet treatment nozzle of the present invention is not limited to this and the ultrasonic cleaners shown in FIGS. 3 to 11 may be used.

A description is subsequently given of preferred embodiments of other ultrasonic cleaner according to the present invention.

Figure 14A:
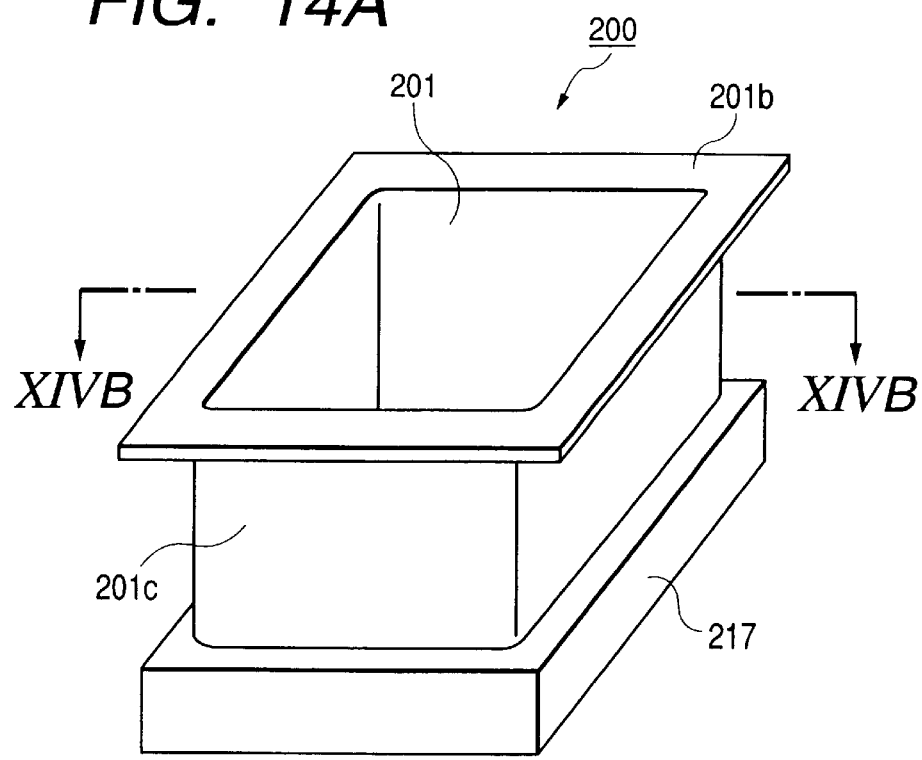
FIG. 14A is a perspective view of a first embodiment of other ultrasonic cleaner according to the present invention and FIG. 14B is an enlarged longitudinal sectional view cut on line XIVb—XIVb of FIG. 14A.
Figure 14B:
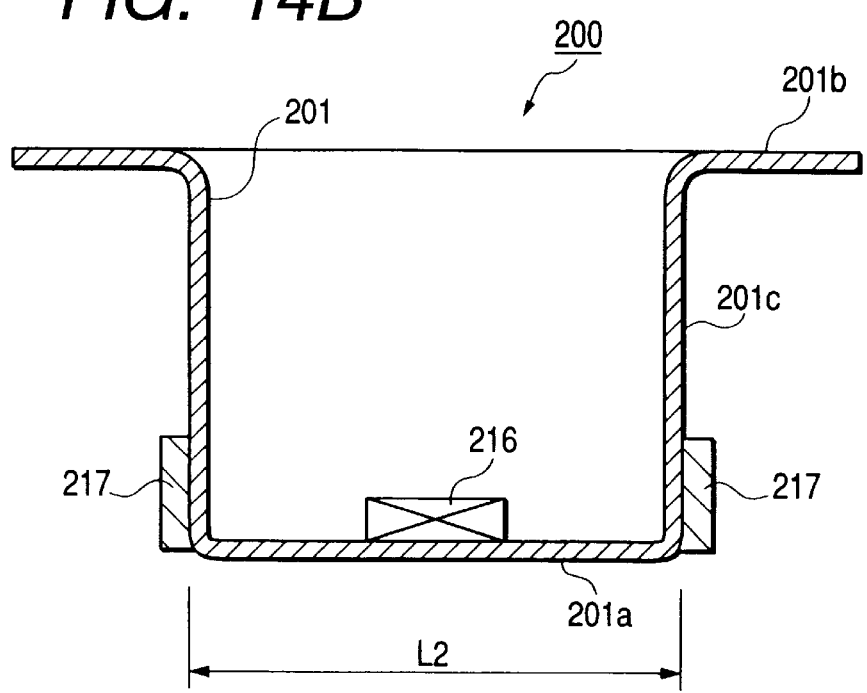

As shown in FIGS. 14A and 14B, an ultrasonic cleaner 200 which is the first embodiment of the other ultrasonic cleaner comprises a tank-like housing 201 whose center portion 201a is depressed and whose end portion 201b around the center portion 201a is formed like a visor, an ultrasonic transducer 216 installed on the surface of the center portion 201a of the housing and a ring-shaped weight 217 provided on the entire surface of the outer lower portion of the wall 201c of the housing.

This ultrasonic cleaner 200 irradiates an object to be treated passing through a cleaning liquid (not shown) below the radiation surface having the width L2 of the housing 201 with ultrasonic waves by vibrating the ultrasonic transducer 216 to clean it.

Figure 15:
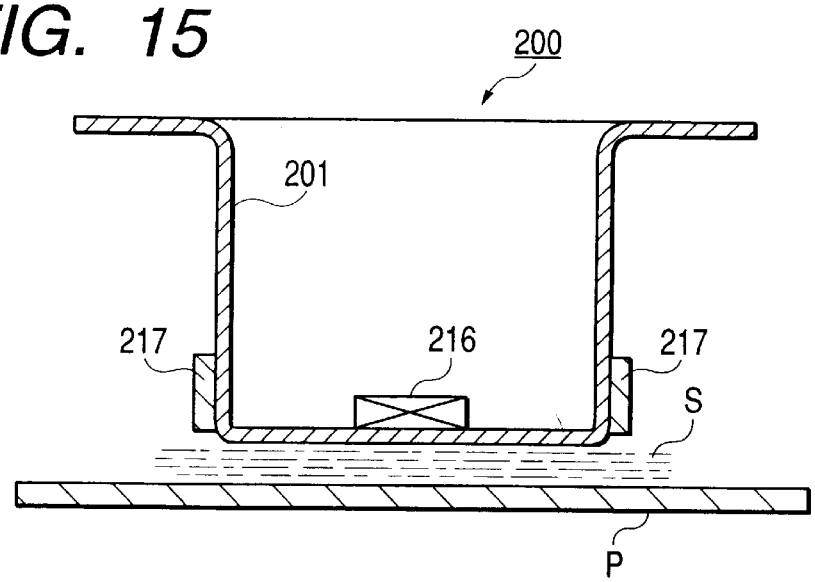
FIG. 15 is a longitudinal sectional view showing that an object to be cleaned is cleaned by the ultrasonic cleaner shown in FIGS. 14A and 14B.

A function and effect obtained by providing this weight 217 will be described hereinunder. As shown in FIG. 15, the center portion 201a of the housing 201 of the ultrasonic cleaner 200 is immersed in the cleaning liquid S and the object P passes below the ultrasonic cleaner 216. The ultrasonic transducer 216 is vibrated by an unshown ultrasonic wave generator to irradiate the object P passing below the radiation surface having the width L2 of the housing 201 with ultrasonic waves to clean it. During this treatment, ultrasonic energy radiated from the ultrasonic transducer 216 can be prevented from propagating to the housing 201 and the upper portion of the weight 217 extremely well due to the existence of the weight 217, whereby the ultrasonic energy propagates to the cleaning liquid S from the bottom 201a to clean the object well.

The second and third embodiments of the other ultrasonic cleaner according to the present invention will be described with reference to FIG. 16 and FIG. 17. In these embodiments, another weight is provided in addition to the weight 217 of the first embodiment of the other ultrasonic cleaner shown in FIGS. 14A and 14B. The same constituent members as those shown in FIGS. 14A and 14B are given the same reference symbols and their descriptions are omitted.

Figure 16:
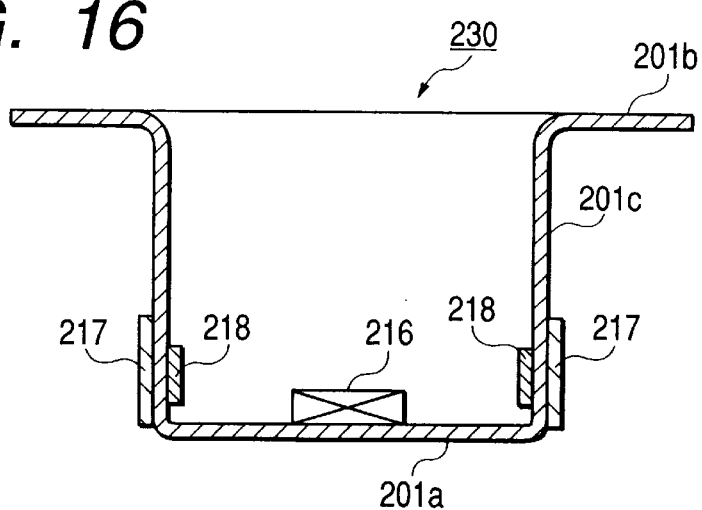
FIG. 16 is a longitudinal sectional view of a second embodiment of the other ultrasonic cleaner according to the present invention.

The second embodiment of the other ultrasonic cleaner shown in FIG. 16 is an ultrasonic cleaner 230 in which a second ring-shaped weight 218 is provided on the entire surface of the inner lower portion of the wall 201c of the housing 201. In the second embodiment, the weight 217 can be made smaller than that of the first embodiment by providing the weight 218, whereby the polishing of the outer wall surface and the outer bottom surface of the housing 201 including the weight 217 is carried out very easily and the stability of the nozzle is improved. The effect of propagating ultrasonic energy to the cleaning liquid effectively can be made the same as that of the first embodiment shown in FIGS. 14A and 14B.

Figure 17:
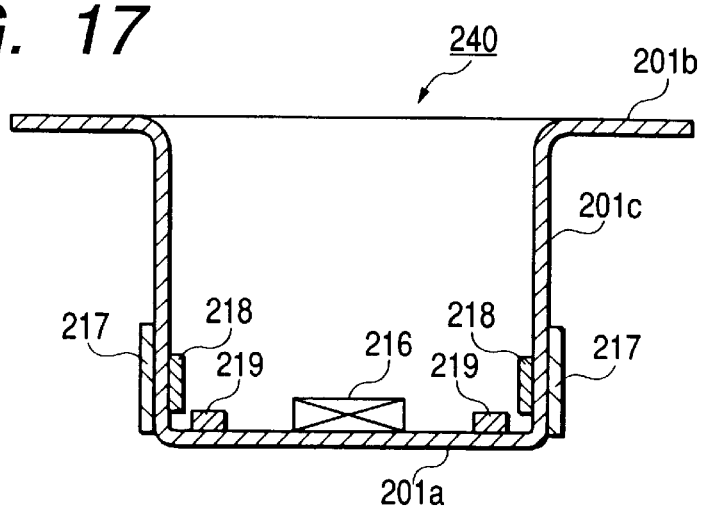
FIG. 17 is a longitudinal sectional view of a third embodiment of the other ultrasonic cleaner according to the present invention.

The third embodiment of the other ultrasonic cleaner shown in FIG. 17 is an ultrasonic cleaner 240 in which a third ring-shaped weight 219 is further provided on the entire surface of the inner peripheral portion of the bottom 201a of the housing 201 of the cleaner shown in FIG. 16. In this third embodiment, the weight 217 can be made much smaller than that of the first embodiment shown in FIGS. 14A and 14B by providing the weights 218 and 219. Thereby, the polishing of the outer wall surface and the outer bottom surface of the housing can be carried out more easily than the second embodiment and the stability of the wet treatment nozzle can be improved.

Further, the fourth embodiment of the other ultrasonic cleaner according to the present invention will be described with reference to FIGS. 18A and 18B. In this embodiment, the weight 217 in the first embodiment shown in FIGS. 14A and 14B is eliminated and another weight is provided on the housing 201 instead. The same constituent members as those of FIGS. 14A and 14B are given the same reference symbols and their descriptions are omitted.

Figure 18A:
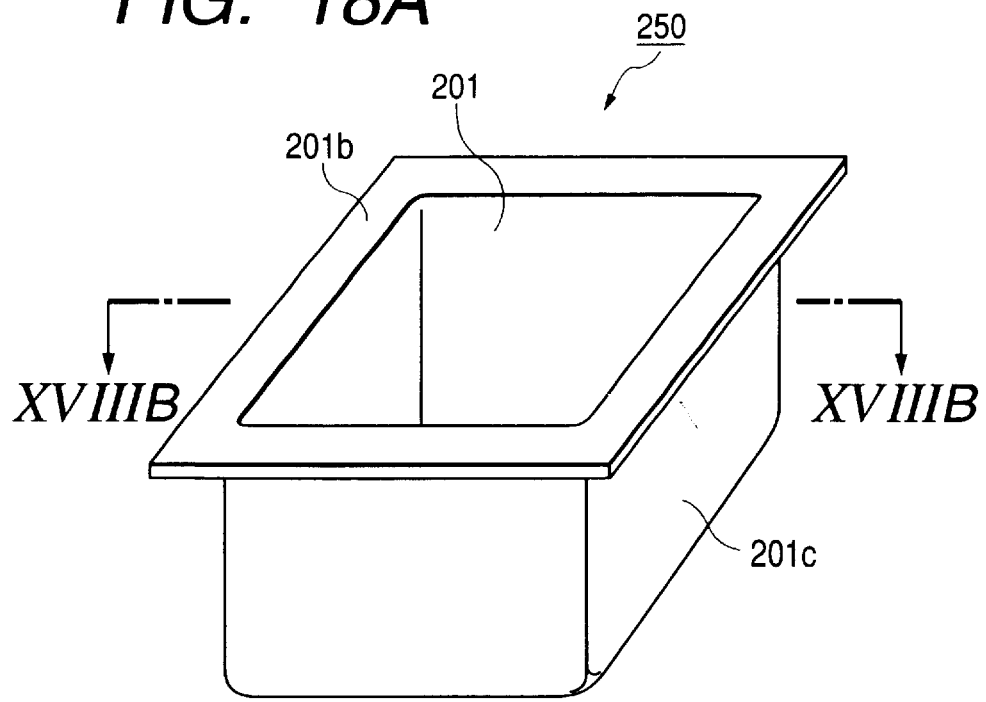
FIG. 18A is a perspective view of a fourth embodiment of the other ultrasonic cleaner according to the present invention and FIG. 18B is an enlarged longitudinal sectional view cut on line XVIIIb—XVIIIb of FIG. 18A.
Figure 18B:
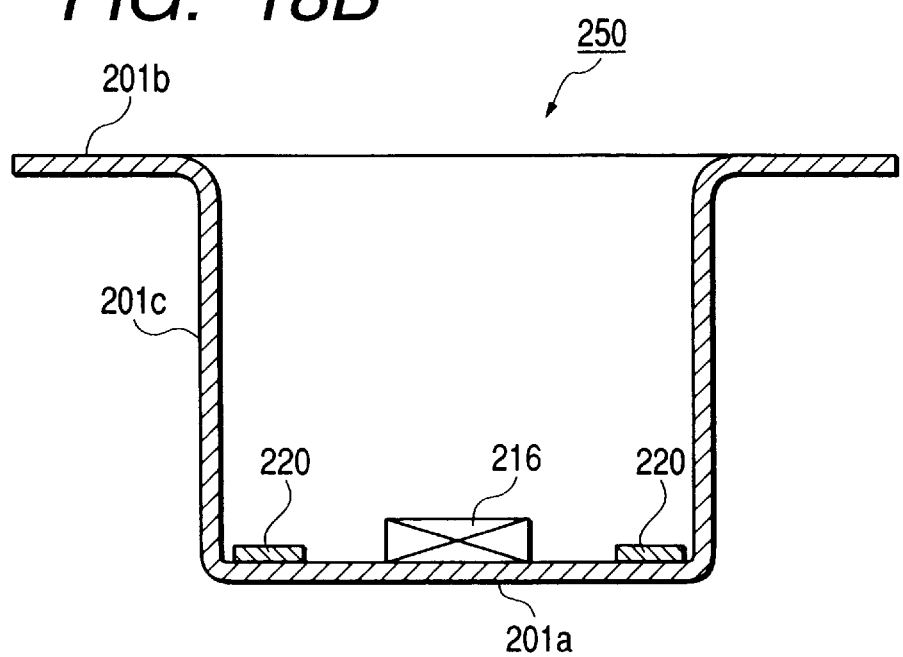

The fourth embodiment shown in FIGS. 18A and 18B is an ultrasonic cleaner 250 in which a fourth ring-shaped weight 220 is provided on the entire surface of the inner peripheral portion of the bottom 201a of the housing 201. In this embodiment, as there is only the weight 220 and nothing else is added to the outer wall surface of the housing 201 compared with the first embodiment shown in FIGS. 14A and 14B, the polishing of the outer wall surface and the outer bottom surface of the housing 201 can be carried out the most easily and the stability of the wet treatment nozzle can be greatly improved.

An embodiment of the wet treatment nozzle of the present invention using the above ultrasonic cleaner will be described with reference to FIGS. 19A and 19B.

This wet treatment nozzle 310 comprises an introduction passage 311 for introducing a treatment liquid (not shown) on one side, an exhaust passage 312 for exhausting the treatment liquid S after a wet treatment on the other side, and a vibration guide member 313, interposed between the introduction passage 311 and the exhaust passage 312, for guiding the treatment liquid introduced from the introduction passage 311 to an object to be treated (not shown) and wet treating the object while vibrating it. The ultrasonic cleaner 230 shown in FIG. 16 is used as the vibration guide member 313. Therefore, the same members as those of FIG. 16 are given the same reference symbols in FIGS. 19A and 19B and their descriptions are omitted.

Figure 19A:
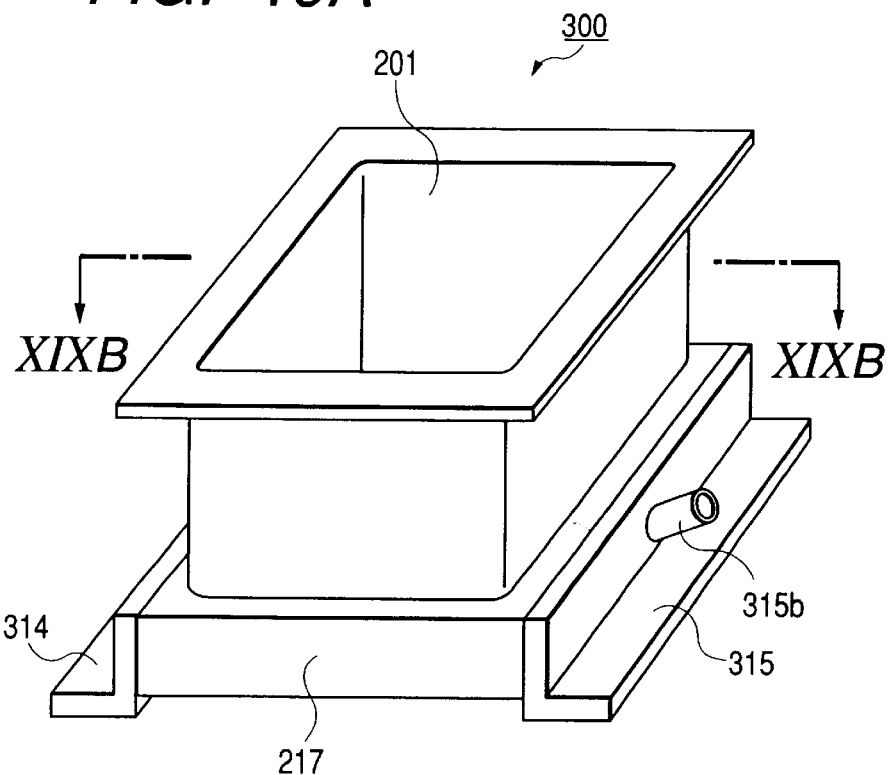
FIG. 19A is a perspective view of an embodiment of other wet treatment nozzle according to the present intention and FIG. 19B is an enlarged longitudinal sectional view cut on line XIXb—XIXb of FIG. 19A.
Figure 19B:
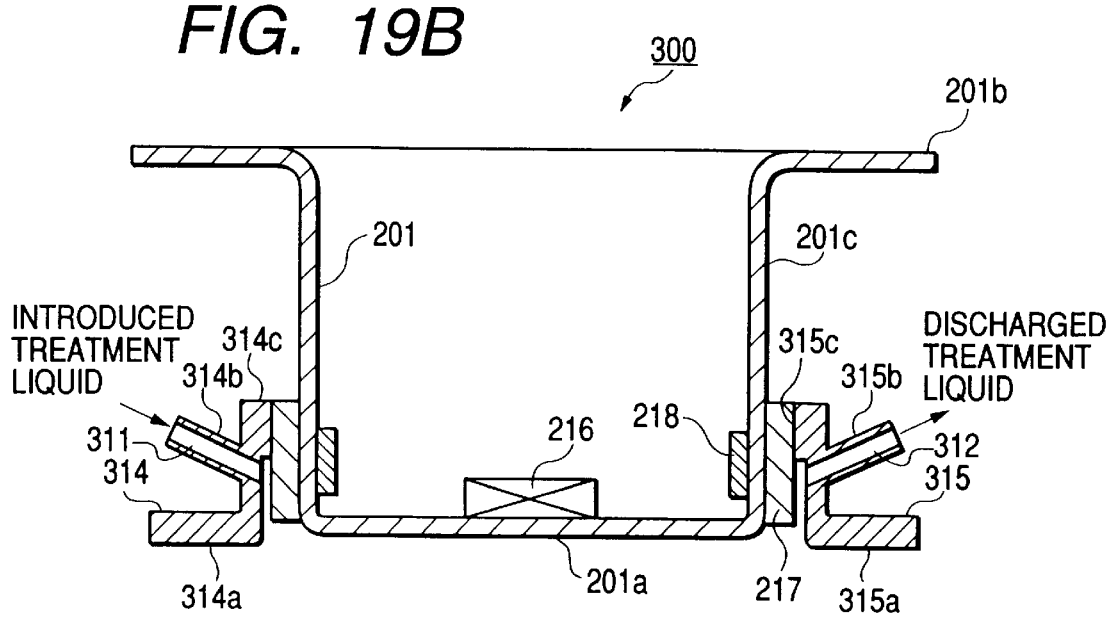

In FIGS. 19A and 19B, an introduction passage frame 314 having the introduction passage 311 formed therein is made of a stainless steel metal plate having an L-shaped cross section and its bottom 314a is made flush or almost flush with the bottom 201a of the vibration guide member. The introduction passage frame 314 has an introduction tube 314b extending obliquely upward in the center portion in a longitudinal direction and its wall 314c is connected to the weight 217 provided on the outer surface of the wall 201c of the vibration guide member by welding. This connection may be carried out with a bolt and a nut.

Similarly, the exhaust passage frame 315 having the exhaust passage 312 formed therein is made of a stainless steel metal plate having an L-shaped cross section and its bottom 315a is made flush or almost flush with the bottom 201a of the vibration guide member. The exhaust passage frame 315 has an exhaust tube 315b extending obliquely upward in the center portion in a longitudinal direction and its wall 315c is connected to the weight 217 provided on the outer surface of the wall 201c of the vibration guide member by welding. This connection may be carried out with a bolt and a nut.

This wet treatment nozzle 300 is provided with a pressure controller (not shown) for controlling the difference between the pressure of the treatment liquid in contact with the object to be treated and atmospheric pressure so that the treatment liquid in contact with the object does not flow to the outside of the exhaust passage after the wet treatment. This wet treatment nozzle 300 is also provided a positioning unit (not shown) for maintaining a predetermined space between the vibration guide member 313 and the object and holding the treatment liquid in the space.

Figure 20:
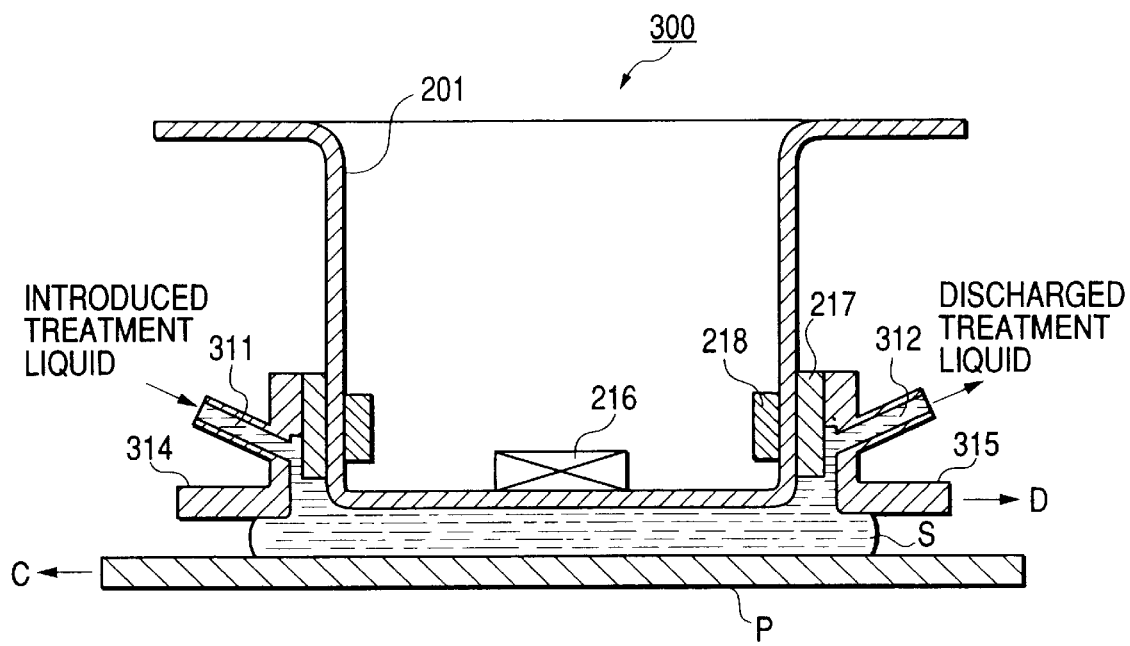
FIG. 20 is a sectional view showing that an object to be cleaned is cleaned by the wet treatment nozzle shown in FIGS. 19A and 19B.
Figure 21:
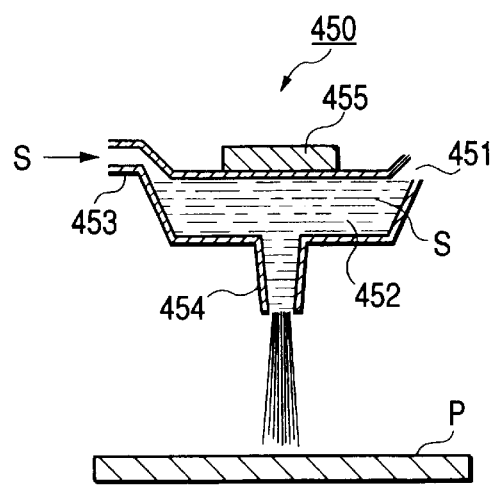
FIG. 21 is a longitudinal sectional view of an ultrasonic shower cleaner of the prior art.
Figure 22:
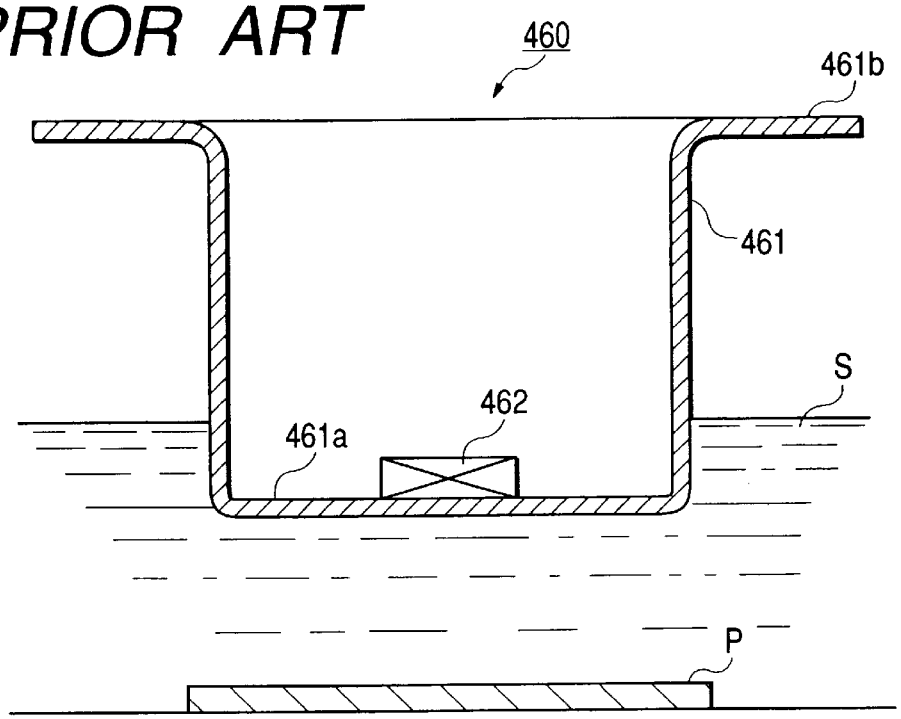
FIG. 22 is a longitudinal sectional view of a water saving ultrasonic cleaner of the prior art.
Figure 23:
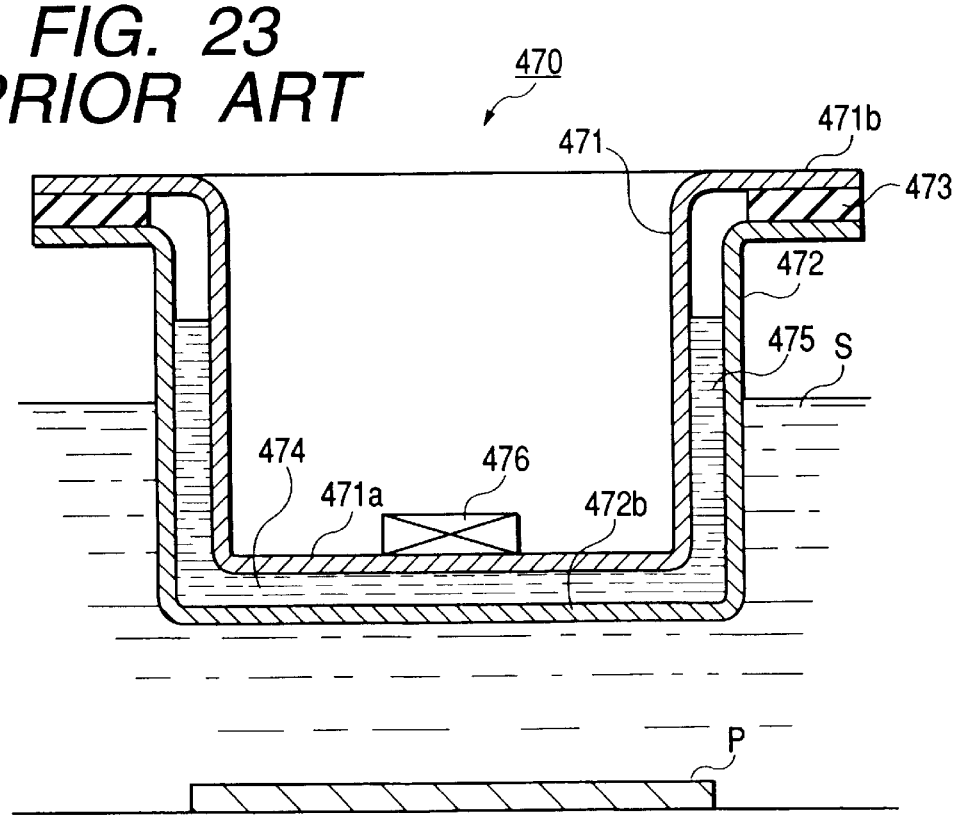
FIG. 23 is a longitudinal sectional view of a water saving ultrasonic cleaner of a double tank system of the prior art.

A wet treatment method using this wet treatment nozzle will be described with reference to FIG. 20.

The treatment liquid S, for example, ultra pure water, electrolyzed ion water, ozone water or hydrogen water is supplied to the object P to be treated through the introduction passage 311 while the object P to be treated and the wet treatment nozzle 300 are moved in directions C and D relative to each other, respectively, and the treatment liquid S is exhausted from above the object P without contacting a portion other than the portion to which the treatment liquid S is supplied by controlling the difference between the pressure of the treatment liquid S in contact with the object P and atmospheric pressure by means of the pressure controller (not shown).

The wet treatment nozzle shown in FIGS. 19A and 19B comprises the ultrasonic cleaner shown in FIG. 16 as the vibration guide member. The wet treatment nozzle of the present invention is not limited to this and the ultrasonic cleaners shown in FIGS. 14, 17 and 18 may be used.

As described above, according to the ultrasonic cleaner of the present invention, since the vibration of the wall of the housing is suppressed by the weight, vibration energy returns toward the bottom of the center portion of the housing through the liquid for preventing empty heating or the housing itself and is radiated from the bottom as ultrasonic waves efficiently. Therefore, an ultrasonic cleaner capable of adjusting the radiation efficiency of ultrasonic waves easily and a wet treatment nozzle comprising the same are obtained.

What is claimed is:

1. An ultrasonic cleaner comprising:
   a first housing having a U-shaped cross section;
   an ultrasonic transducer placed on an inner bottom surface of the first housing;
   a second housing is connected to said first housing such that a hollow portion is created between the first and second housings, which hollow portion contains a liquid in which ultrasonic waves are created by said ultrasonic transducer;
   a weight, provided on either said first or said second housing, for preventing the vibration of a wall of the weighted housing.

2. The ultrasonic cleaner according to claim 1, wherein the weight is provided on at least one of an outer wall surface and an inner wall surface of the weighted housing.

3. The ultrasonic cleaner according to claim 1, wherein the weight is provided on the inner bottom surface of the weighted housing in an area where vibration caused by the ultrasonic transducer is not prevented.

4. The ultrasonic cleaner according to claim 1, wherein eight is formed by changing a thickness of the weighted housing.

5. The ultrasonic cleaner according to claim 1, wherein the weight is provided on the entire surface of the wall of the weighted housing.

6. A wet treatment nozzle which comprises an introduction passage for introducing a treatment liquid on a side, an exhaust passage for exhausting the treatment liquid after a wet treatment on an other side, and a vibration guide member, interposed between the introduction passage and the exhaust passage, for guiding the treatment liquid introduced from the introduction passage to an object to be treated and wet treating the object while vibrating it, wherein
   the vibration guide member is the ultrasonic cleaner of claim 1.

7. An ultrasonic cleaner comprising:
   a housing having a U-shaped cross section, comprising an inner and an outer U-shaped portion, and a hollow portion there between;
   an ultrasonic transducer placed on an inner bottom surface of the inner U-shaped portion of the housing;
   a liquid for preventing empty heating charged into the hollow portion to transmit vibration from the ultrasonic transducer to an outer bottom surface of said outer aped portion of the housing; and
   a weight provided on the housing to prevent the vibration of a wall of the housing.

8. The ultrasonic cleaner according to claim 7, wherein the weight is provided on at least one of an outer wall surface or an inner wall surface forming the outer U-shaped portion of the housing.

9. The ultrasonic cleaner according to claim 7, wherein the weight is provided on at least one of an outer wall surface and an inner wall surface forming the inner U-shaped portion of the housing.

10. The ultrasonic cleaner according to claim 7, wherein the weight is provided on at least one of an inner bottom surface of the outer U-shaped portion and the bottom surface of the inner U-shaped portion of the housing in an area here vibration caused by the ultrasonic transducer is not prevented.

11. The ultrasonic cleaner according to claim 7, wherein the weight is formed by changing the thickness of the outer U-shaped portion or the inner U-shaped portion of the housing.

12. The ultrasonic cleaner according to claim 7, wherein the weight is provided on the entire surface of the wall of the housing.

13. An ultrasonic cleaner comprising:
a first housing having a U-shaped cross section including an outer wall having an end portion;
a rim extending from the end portion of the outer wall;
an ultrasonic transducer placed on an inner bottom surface of the U-shaped first housing;
a second housing having a center portion that is depressed and has an end portion including a rim along said end portion that is arranged around said first housing whose end portion of its outer wall has a rim there along, such that a hollow portion is formed between the first housing and the second housing by sandwiching a packing between the end portions of the housings;
a liquid for preventing empty heating charged into the hollow portion to transmit vibration from the ultrasonic transducer to the outer bottom surface of the second U-shaped housing; and
a weight provided on a housing to prevent the vibration of a wall of the housing.

14. The ultrasonic cleaner according to claim 13, wherein the packing is made of an elastic member having a through hole in the center, the first housing and the second housing are made of a plate member, the elastic member is sandwiched between the rim of the first housing and the rim of the second housing by a bolt penetrating these end portions, and the thickness of the packing is changed by adjusting the fastening degree of the bolt.

15. A wet treatment nozzle comprising an introduction passage for introducing a treatment liquid on a side, an exhaust passage for exhausting the treatment liquid after a wet treatment on an other side, and a vibration guide member, interposed between the introduction passage and the exhaust passage, for guiding the treatment liquid introduced from the introduction passage to an object to be treated and wet treating the object while vibrating it, wherein
the vibration guide member is the ultrasonic cleaner of claim 7.

16. The wet treatment nozzle according to claim 6, wherein the weight is provided on at least one of the outer wall surface and the inner wall surface of the weighted housing in the ultrasonic cleaner.

17. The wet treatment nozzle according to claim 6, wherein the weight is provided on the inner bottom surface of the weighted housing in an area where vibration caused by the ultrasonic transducer is not prevented in the ultrasonic cleaner.

18. The wet treatment nozzle according to claim 6, wherein the weight is formed by changing the thickness of the weighted housing in the ultrasonic cleaner.

19. The wet treatment nozzle according to claim 6, wherein the weight is provided on the entire surface of the wall of the weighted housing in the ultrasonic cleaner.

20. The wet treatment nozzle according to claim 15, wherein the weight is provided on at least one of the outer wall surface and inner wall surface forming the outer U-shaped portion of the housing in the ultrasonic cleaner.

21. The wet treatment nozzle according to claim 15, wherein the weight is provided on at least one of the outer wall surface and the inner wall surface forming the inner U-shaped portion of the housing in the ultrasonic cleaner.

22. The wet treatment nozzle according to claim 15, wherein the weight is provided on at least one of the inner bottom surface of the outer U-shaped portion and the bottom surface of the inner U-shaped portion of the housing in an area where vibration caused by the ultrasonic transducer is not prevented in the ultrasonic cleaner.

23. The wet treatment nozzle according to claim 15, wherein the weight is formed by changing the thickness of the outer U-shaped portion or the inner U-shaped portion of the housing in the ultrasonic cleaner.

24. The wet treatment nozzle according to claim 15, wherein the weight is provided on the entire surface of the wall of the housing in the ultrasonic cleaner.

25. The wet treatment nozzle according to claim 15, wherein the housing is constructed such that said inner U-shaped portion of said housing whose center portion is depressed has an upper rim around its open end, said outer U-shaped portion of said housing whose center portion is depressed has a lower rim around its open end that extends around said upper rim such that a hollow portion is formed between the inner and outer U-shaped portions of said housing by sandwiching a packing between the upper and lower rims.

26. The wet treatment nozzle according to claim 25, wherein the packing is formed of an elastic member having a through hole in the center, the inner and outer U-shaped portions of said housing are made of a plate member, the elastic member is sandwiched between the upper rim of the inner U-shaped portion and the lower rim of the outer U-shaped portion by a bolt penetrating these rims, and the thickness of the packing is changed by adjusting the fastening degree of the bolt in the ultrasonic cleaner.

* * * * *